United States Patent [19]
Tohyama et al.

[11] Patent Number: 5,930,654
[45] Date of Patent: Jul. 27, 1999

[54] METHOD OF PRODUCING SEMICONDUCTOR DEVICES INCLUDING A STEP OF DICING A SEMICONDUCTOR WAFER WHILE COVERING THE SEMICONDUCTOR WAFER BY A TAPE

[75] Inventors: Yoshihiro Tohyama; Takanori Muramoto; Akihisa Hayashida; Hidenori Akatani, all of Kasugai, Japan

[73] Assignee: Fujitsu Limited, Kanagawa, Japan

[21] Appl. No.: 08/746,552

[22] Filed: Nov. 13, 1996

[30] Foreign Application Priority Data

Feb. 13, 1996 [JP] Japan .................................. 8-025620

[51] Int. Cl.$^6$ ..................... H01L 21/301; H01L 21/46; H01L 21/78
[52] U.S. Cl. ..................... 438/464; 438/118; 428/354
[58] Field of Search ..................... 438/464, 118; 428/354

[56] References Cited

U.S. PATENT DOCUMENTS 3,562,058  2/1971  Boyd ........................................ 438/464

Primary Examiner—Brian Dutton
Attorney, Agent, or Firm—Armstrong, Westerman, Hattori, McLeland & Naughton

[57] ABSTRACT

A method of producing semiconductor devices includes the steps of disposing an adhesive tape over a wafer such that an adhesive surface of said tape faces a top surface of said wafer, disposing a flexible urging member over the tape in a state that the flexible urging member causes a deformation by a gravity such that the flexible urging member causes a bulging in a downward direction toward the adhesive tape, moving the flexible urging member relatively to the adhesive tape in engagement with the adhesive tape such that the adhesive tape is deformed in conformity with the flexible urging member and the adhesive tape causes a bulging in a downward direction toward the wafer, and contacting the deformed adhesive tape on the top surface of the wafer.

9 Claims, 9 Drawing Sheets

METHOD OF PRODUCING SEMICONDUCTOR DEVICES INCLUDING A STEP OF DICING A SEMICONDUCTOR WAFER WHILE COVERING THE SEMICONDUCTOR WAFER BY A TAPE

BACKGROUND OF THE INVENTION

The present invention generally relates to fabrication of semiconductor devices and more particularly to a dicing of a semiconductor wafer into individual semiconductor chips while covering the semiconductor wafer by a tape.

In the fabrication process of semiconductor devices, a number of semiconductor devices are formed on a common semiconductor wafer. The wafer thus formed with the semiconductor devices are then subjected to a dicing process in which the semiconductor wafer is divided into individual chips by a saw.

In this dicing process, a tape or other suitable adhesive medium is provided on a rear side of the semiconductor wafer, opposite to the side on which the semiconductor devices are formed, and the dicing is carried out in such a state so that the chips formed as a result of the dicing do not scatter. Thereby, only the semiconductor wafer is diced, while the tape itself remains intact. By using such a tape, the semiconductor chips maintain the arrangement on the tape even after the dicing process, and the use of automatic assembling apparatus that picks up the chips one by one is substantially facilitated.

However, a typical semiconductor wafer, typically having a thickness of 320 $\mu$m, tends to warp such that a front side where the semiconductor devices are formed is projected and the opposite, rear side is concaved. Thus, mere attachment of a tape on the rear side of the wafer tends to leave a void at the central part of the concaved rear surface, and the semiconductor chips corresponding to such a central part of the wafer tend to litter or scatter after the dicing process because of the poor adherence to the tape.

Figure 1:
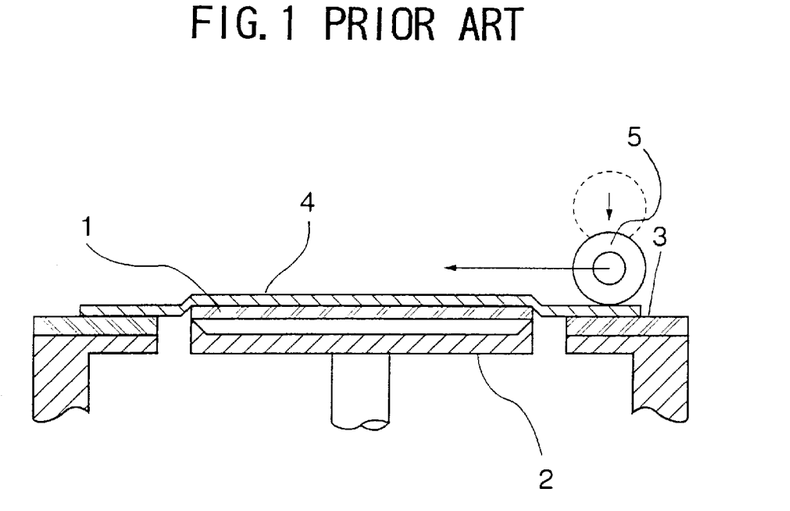
FIG. 1 is a diagram showing a construction of a conventional tape attachment apparatus used in the production of semiconductor devices.

In order to prevent such a scattering of the chips as well as possible damages to the chips thus scattered, a conventional apparatus used for attaching the tape applies a roller on the taped surface of the substrate as indicated in FIG. 1.

Referring to FIG. 1, a semiconductor wafer 1 held on a stage 2 of the tape attachment apparatus is covered by an adhesive tape 4 on the upper principal surface thereof, wherein the tape 4 is held on a frame 3. No semiconductor devices are formed on the upper principal surface of the substrate. Further, a roller 5 is urged against the tape 4 from an upward direction and is moved over the tape 4 such that any void between the tape 4 and the upper major surface of the substrate 1 is collapsed. It should be noted that the attachment of the tape 4 is carried out in a vacuum environment. Thus, the apparatus of FIG. 1 is placed in a vacuum chamber.

However, the apparatus of FIG. 1 has a drawback in that it is necessary to provide a mechanism that urges the roller 5 against the tape 4 and move the roller 5 over the tape 4. Thereby, it is necessary to provide a very large vacuum chamber for accommodating the apparatus of FIG. 1, while use of such a large volume vacuum chamber necessitates a substantial time for evacuation. Further, use of such a roller 5, which urges one point at a time, may cause a damage to the wafer 1 due to an excessive load. Further, use of such a roller 5 tends to cause a deformation of the adhesive tape 4 on the upper major surface of the substrate 1 as a result of the pressure applied to the tape 4 by the roller 5. When the tape 4 is deformed, the semiconductor chips obtained after the dicing may be displaced from the nominal position and the use of automatic assembling apparatus for picking up the chips becomes difficult.

Figure 2:
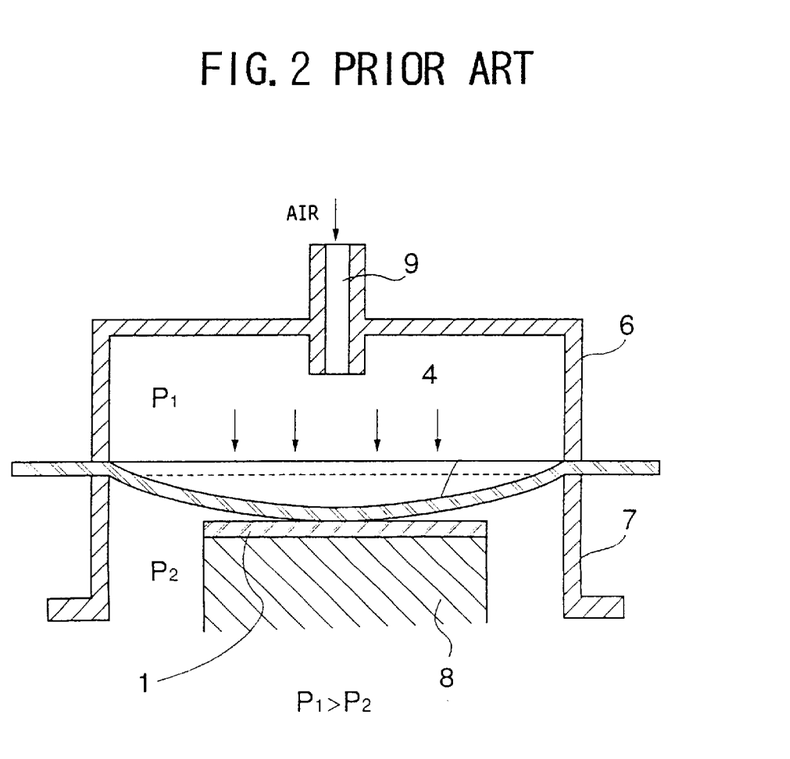
FIG. 2 is a diagram showing another construction of a conventional tape attachment apparatus.

FIG. 2 shows another conventional construction for attaching a tape on a semiconductor wafer before dicing, wherein those parts corresponding to the parts described heretofore are eliminated.

Referring to FIG. 2 showing a wafer stage 8 provided in a lower chamber 7 and an upper chamber 6 provided on the lower chamber 7 to form a vacuum chamber, it should be noted that the lower chamber 7 is evacuated to a pressure $P_2$ while introducing the air to the upper chamber 6 via a duct 9 such that the pressure inside the upper chamber 6 becomes $P_1$. The pressure $P_1$ is thus higher than the pressure $P_2$ ($P_1 > P_2$).

As a result of such a pressurization of the upper chamber 6, the tape 4 is bulged in the direction of the lower chamber 7, forming a projecting surface on the side facing the semiconductor wafer 1 as indicated in FIG. 2. By lifting up the wafer stage 8 and hence the wafer 1 in the upward direction in this state, the tape 4 first contacts with the center of the concaved surface of the waver 1. With further upward movement of the stage 8, the area of contact increases gradually from the center to the rim of the wafer 1, without forming a void between the wafer 1 and the tape 4.

In the construction of FIG. 2, it is necessary to control the pressures $P_1$ and $P_2$ such that the pressure actually acting upon the tape 4 is held constant and optimum. However, such an adjustment of the pressure $P_1$ in the upper chamber 6 and the pressure $P_2$ in the lower chamber 7 is difficult. When the pressure $P_1$ is too low, for example, sufficient urging force is not obtained for applying the tape 4 against the wafer 1. When the pressure $P_1$ is too high, on the other hand, the bulging of the tape 4 as well as the tensile force acting on the tape 4 becomes excessive, and the tape 4 experiences a plastic deformation. Thereby, the semiconductor chips on the tape are, after the dicing process, displaced from the nominal position, and the use of the automatic assembling apparatus becomes difficult.

Figure 3:
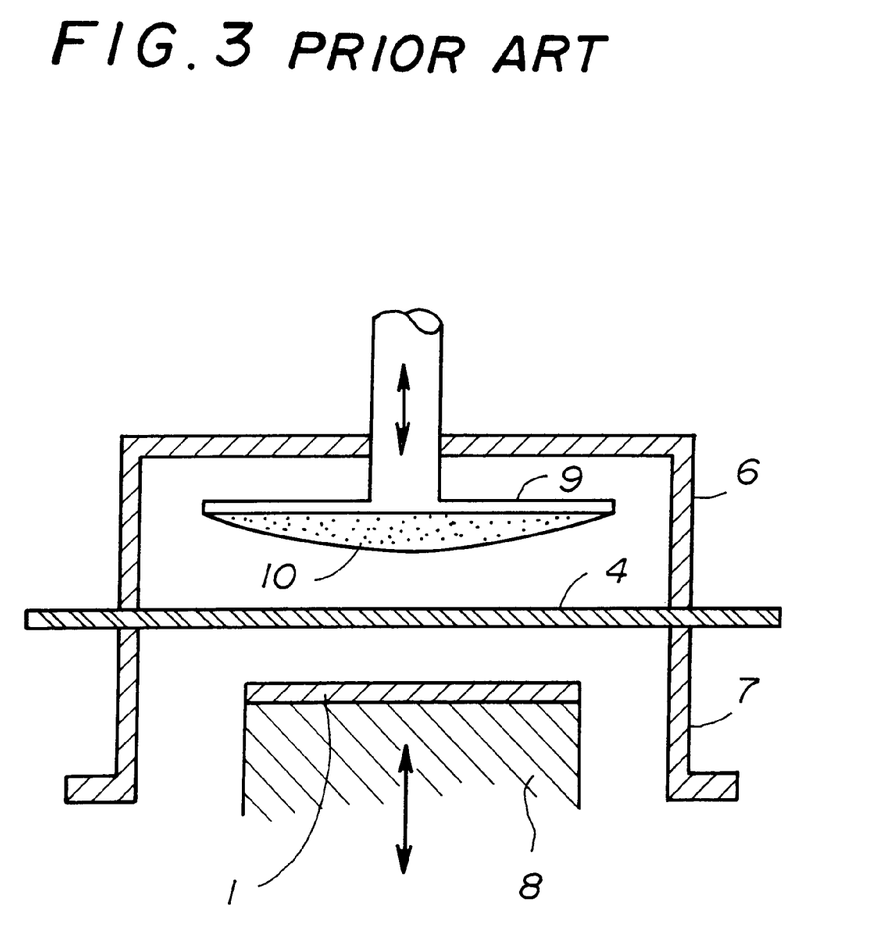
FIG. 3 is a diagram showing still another construction of a conventional tape attachment apparatus.

FIG. 3 shows a further conventional apparatus for applying a tape upon a concaved surface of a semiconductor wafer as disclosed in the Japanese Laid-open Patent Publication 4-65109, wherein those parts described previously are designated by the same reference numerals and the description thereof will be omitted.

Referring to FIG. 3, there is provided a movable member 9 movable in up and down directions in the upper chamber 6, wherein the movable member 9 carries thereon a deformable, resilient member 10 that has a shape protruding or bulging in the downward direction in correspondence to the concaved upper major surface of the wafer 12. By lowering the movable member 9, the bulging surface of the resilient member 10 engages with the tape 4 and causes the tape to bulge in the downward direction. Thus, by lifting the stage 8 in the upward direction in the state that the tape 4 is bulged in the downward direction, the tape 4 first engages with the center of the concaved surface of the wafer 1, and the area of the contact increases gradually toward the rim of the wafer 1 with further lifting-up of the stage 8.

However, the apparatus of FIG. 3, relying upon the mechanical deformation of the resilient member 10 for causing the desired deforming the tape 4, also has a problem in that the control of the urging force of the tape 4, particularly the distribution of the urging force over the concaved surface of the wafer 1, is difficult. In view of the very small thickness of the wafer 1, such a construction, in which the urging force of the tape 4 acting over the wafer 1 is controlled by the respective urging forces of the movable members 8 and 9 and further by the resiliency of the deformable member 10, there is a substantial risk that the wafer 1 is damaged during the process of applying the tape 4 thereon.

SUMMARY OF THE INVENTION

Accordingly, it is a general object of the present invention to provide a novel and useful method of producing semiconductor devices including a step of applying a tape on a wafer in preparation of a dicing process, wherein the aforementioned problems are successfully eliminated.

Another and more specific object of the present invention is to provide a method of applying a tape on a concaved surface of a wafer with a controlled urging force and without risking to cause a damage to the wafer.

Another object of the present invention is to provide an apparatus for applying a tape on a wafer with a controlled urging force and without risking to cause a damage to the wafer.

Another object of the present invention is to provide a method of producing semiconductor devices, comprising the steps of:
  disposing an adhesive tape over a wafer;
  disposing a flexible urging member over said tape, said flexible urging member causing a deformation by gravity such that said flexible member causes a bulging in a downward direction toward said adhesive tape;
  lowering said flexible urging member relatively to said adhesive tape such that said adhesive tape is deformed in conformity with said flexible urging member, said adhesive tape thereby bulging in a downward direction toward said wafer;
  lifting up said wafer with respect to said tape such that said wafer engages with a bottom of said downwardly bulging adhesive tape,
  said step of lifting up said wafer being continued further such that said flexible urging member is deformed, via said intervening adhesive tape, in conformity with a shape of an upper major surface of said wafer.

Another object of the present invention is to provide an apparatus for applying an adhesive tape upon a wafer, comprising:
  a stage adapted to hold a wafer thereon;
  a tape holder adapted to hold an adhesive tape over said wafer on said stage;
  said stage being movable in upward and downward directions with respect to said adhesive tape on said tape holder;
  an urging member provided over said tape holder movably in said upward and downward directions relatively to said adhesive tape on said tape holder;
  said urging member comprising a flexible body bulging in a downward direction toward said tape on said tape holder by gravity;
  a vacuum enclosure enclosing said stage, said tape holder and said urging member; and
  a drive mechanism for causing said stage to move in said upward and downward directions, said drive mechanism further causing said urging means to move in said upward and downward directions.

According to the present invention, the adhesive tape is urged against the semiconductor wafer merely by the gravity of the deformable urging member. No external force is applied. Thus, the urging force applied to the adhesive tape as well as the distribution of the urging force over the tape is controlled exactly and with reproducibility. No excessive force is applied to the tape, and the problem of plastic deformation of the tape that may cause the problem of misalignment of the chips on the tape after the dicing of the wafer, is successfully eliminated. Further, as the tape is urged merely by the gravity of the flexible urging member, the problem of damaging of the thin wafer as a result of the excessive urging force applied to the wafer is effectively eliminated. For example, one can successfully avoid damaging of the wafer even when the control of the drive mechanism for moving up and down the urging member and/or the stage is poor.

Other objects and further features of the present invention will become apparent from the following detailed description when read in conjunction with the attached drawings.

DETAILED DESCRIPTION OF THE PREFERRED EMBODIMENTS

Figure 4:
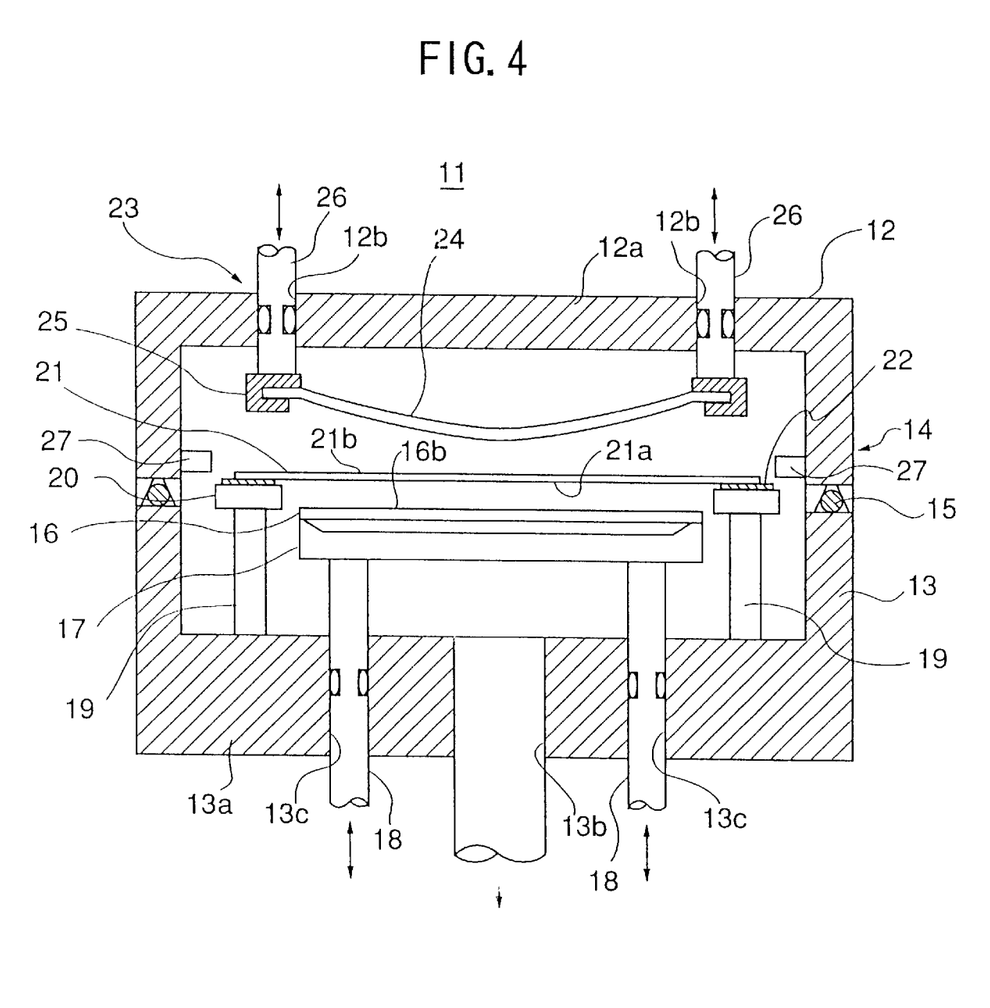
FIG. 4 is a diagram showing a construction of a tape attachment apparatus according to a first embodiment of the present invention.

FIG. 4 shows the construction of a tape attachment apparatus according to a first embodiment of the present invention in a cross sectional view.

Referring to FIG. 4, the tape attachment apparatus includes an upper chamber 12 and a lower chamber 13 that form together a vacuum chamber 14, wherein the upper chamber 12 and the lower chamber 14 engage with each other at a seal ring 15. Further, an evacuation port 13b is formed at a bottom part of the lower chamber 13 for evacuating the vacuum chamber 14.

The lower chamber 13 includes therein a wafer stage 17 for mounting a wafer 16 thereon, wherein it will be seen that the wafer stage 17 is supported by rods 18 that are movable up and down through penetrating holes 13c formed on the lower chamber 13. Thereby, the stage 17 itself is moved up and down at a level not exceeding the top rim of the lower chamber 13. The wafer 16 includes a front side 16a on which semiconductor devices are formed and a rear side 16b where no such a semiconductor device is formed, wherein the wafer 16 is mounted on the stage 17 such that the front side 16a faces the stage 17. As a result, the rear side 16a faces a gravitationally upward direction. As already noted with reference to the description of the prior art, the rear side 16b of the wafer 16 tends to form a concaved surface due to the warp caused in the wafer 16 during the fabrication of semiconductor devices thereon.

Further, it should be noted that the lower chamber 13 carries support pillars 19 that in turn carry a ring-shaped frame stage 20, wherein the frame stage 20 supports a ring-shaped frame 22 of an adhesive tape 21. The support pillars 19 are disposed outside the wafer stage 17 and support the adhesive tape 21 at a level above the level of the stage 17. The adhesive tape 21 has an adhesive side 21a carrying a layer of adhesive and a rear side 21b where no such an adhesive layer is provided, wherein the ring-shaped frame 22 is mounted on the frame stage 20 such that the adhesive side 21a faces the wafer 16 on the stage 17.

As will be explained later, the wafer 16 and the adhesive tape 21 are mounted in a state that the upper chamber 12 is lifted upward and removed from the lower chamber 13, by a handling machine or a robot not illustrated. After the wafer 16 and the tape 21 are thus mounted, the upper chamber 12 is brought into engagement with the lower chamber 13, and the vacuum chamber 14 thus formed is evacuated through the port 13b by energizing a vacuum pump.

The upper chamber 12, on the other hand, carries an urging mechanism 23 that urges the tape 21 against the wafer 16. The urging mechanism 23 includes a circular membrane or flexible sheet 24 of silicone having a weight of typically 200 g and a ring-shaped clamp mechanism 25 that holds the circular rim of the sheet 24, wherein the urging mechanism 23 further includes movable rods 26 movable up and down through penetrating holes 12b formed in a top wall 12a of the upper chamber 12. The rods 26 are connected to the foregoing clamp mechanism 25, and the sheet 24 is moved up and down with the movement of the rods 26 in the upward and downward directions.

The sheet 24 of the present invention is formed of a flexible, elastic material and forms a slackened shape in which the sheet 24 projects or bulges in a gravitationally downward direction by the gravity of the sheet 24 itself in the state that the sheet 24 is held by the champ mechanism 25. Thus, the champ mechanism 25 is pulled up to a lifted-up position in which the sheet 24 is lifted above the tape 21 in the state that the wafer 16 and the tape 21 are mounted into the lower chamber 13. FIG. 4 shows the state immediately after the upper chamber 12 is engaged with the lower chamber 13 to form the sealed vacuum chamber 14.

Figure 7:
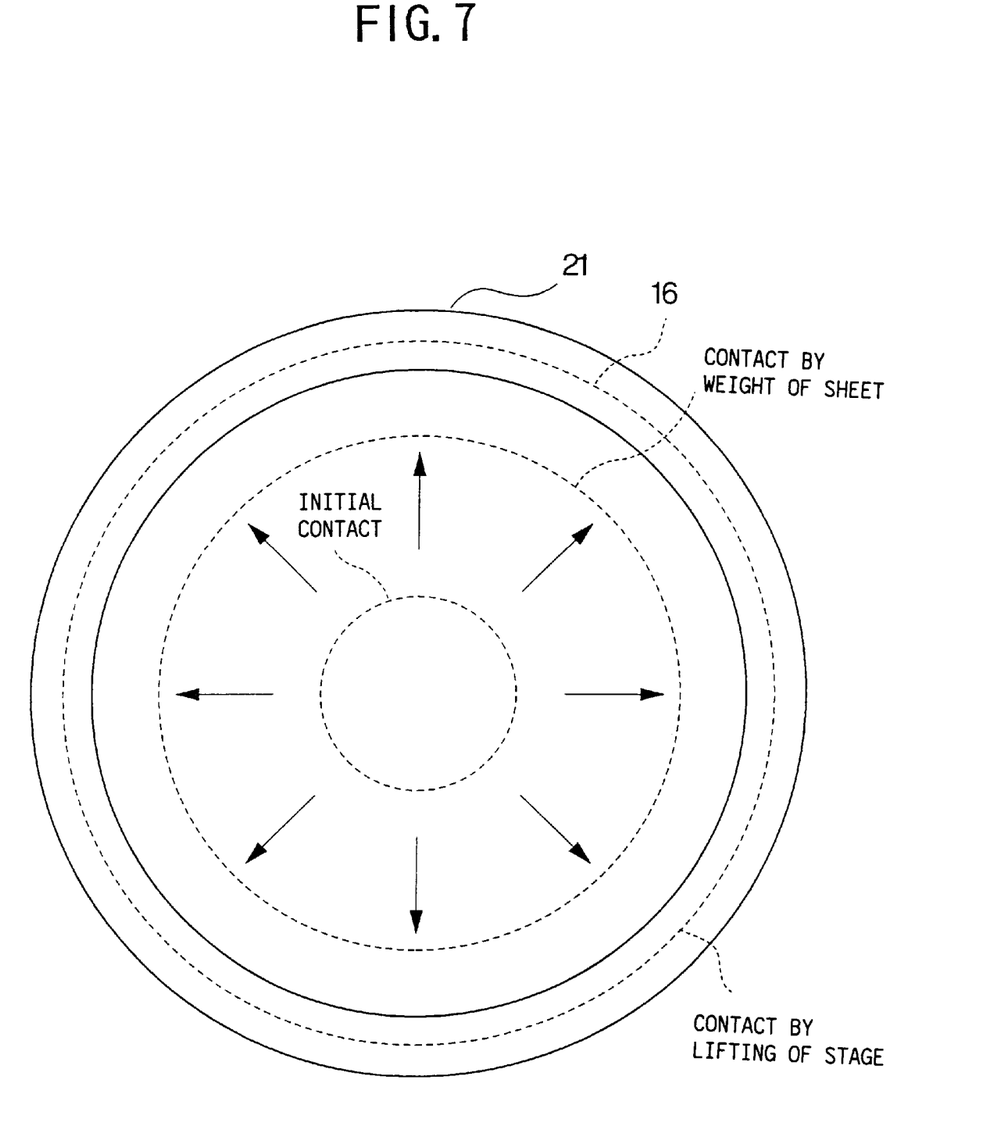
FIG. 7 is a diagram showing the tape in the attachment process of FIGS. 6A–6D.

After the upper chamber 12 is engaged as indicated in FIG. 4 and the chamber 14 is evacuated, the rods 26 are lowered by an external up/down mechanism, wherein it should be noted that the bottom of the downwardly bulging sheet 24 contacts first with a central part of the circular tape 21 and urges the tape 21 in the downward direction. As a result, the tape 21 is deformed into a downwardly bulging shape corresponding to the shape of the sheet 24. Further, by lifting up the stage 17 in the upward direction, the adhesive side 21a of the tape 21 engages with a central part of the rear side 16b of the wafer 16. With further lifting-up of the stage 17, the area of contact of the tape 21 with the wafer 16 increases from the foregoing central part toward the marginal part of the wafer 16 as indicated in FIG. 7, and the tape 21 is applied upon the rear surface 16b of the wafer 16 without forming a void between the tape 21 and the wafer 16. It should be noted that during the process of lifting up the stage 17, the sheet 24 causes an elastic deformation in conformity with the shape of the rear surface 16b of the wafer 16. In the case the sheet 24 has a weight of 300 g as mentioned previously, the tape 21 is urged against the rear surface 16b with an urging pressure of about 0.6 g/cm$^2$.

After the tape 21 is thus attached completely over the rear surface 16b of the wafer 16, the rods 26 are lifted up and the rods 18 are lowered. Thereby, the sheet 24 disengages from the tape 21, leaving the wafer 16 on the stage 17 in the state that the rear surface 16b of the wafer 16 is covered by the tape 21.

In order to facilitate detachment of the sheet 24 from the wafer 16, the sheet 24 may carry minute projections and depressions on the lower major surface thereof.

Further, the construction of FIG. 4 includes a sensor 27 for detecting the correct position of the clamp mechanism 25 when lowering the rods 26. More specifically, the sensor 27 is used to detect that the clamp mechanism 25 has lowered to a predetermined position. After detection of the position by the sensor 27, the lowering of the rods 26 is continued for a predetermined distance. Thereby, it is possible to control the urging force applied to the tape 21 by the sheet 24 exactly, such that the tape 21 is adhered uniformly over the entire rear surface 16b of the wafer 16.

Figure 5:
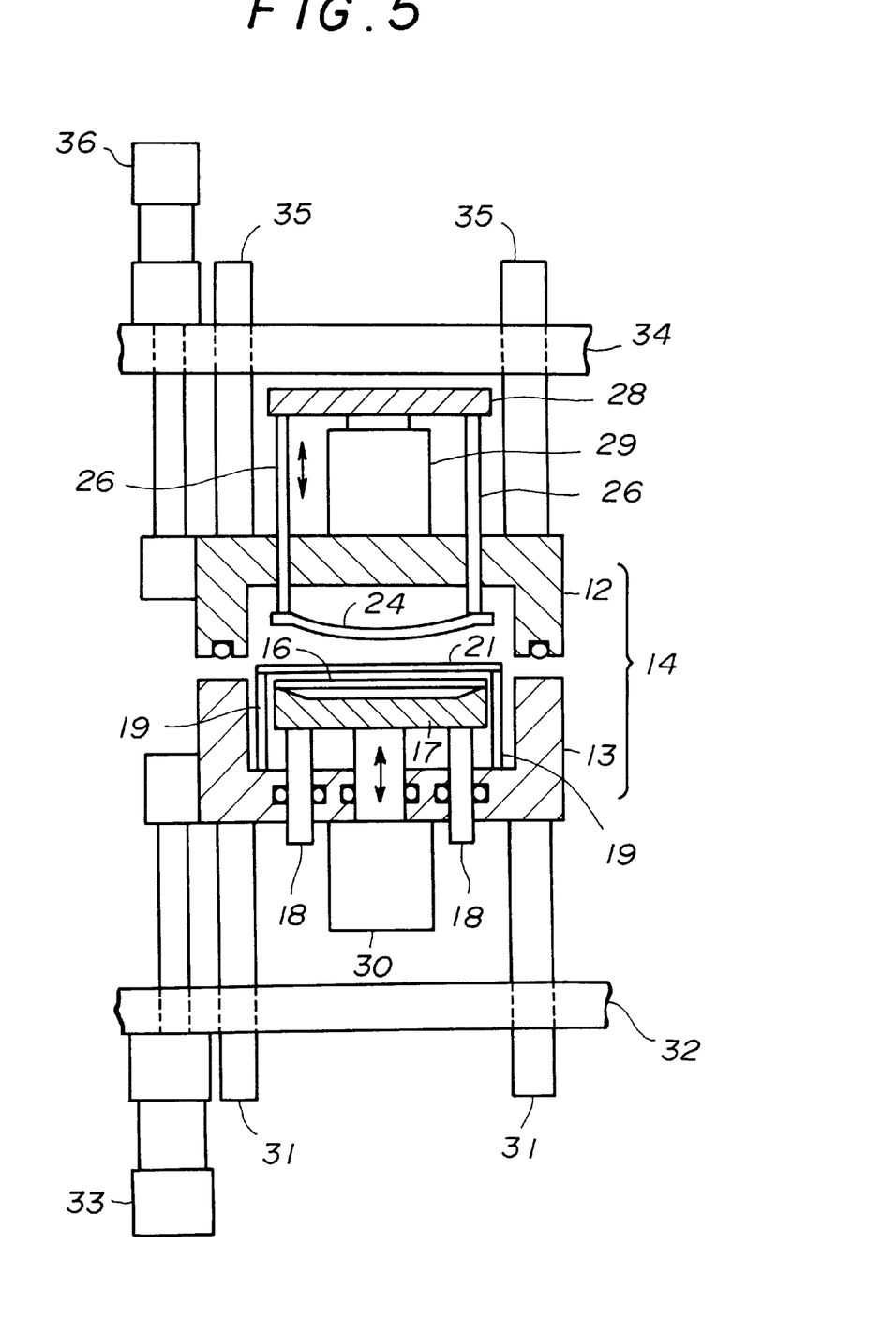
FIG. 5 is a diagram showing the overall construction of the tape attachment apparatus of FIG. 4.

FIG. 5 shows the overall construction of the tape attachment apparatus of FIG. 4, wherein those parts described previously are designated by the same reference numerals and the description thereof will be omitted.

Referring to FIG. 5, the lower chamber 13 is held on guide pillars 31 which in turn is held movably on a lower base 32, wherein the lower base 32 carries a hydraulic cylinder 33 that moves the lower chamber 13 in upward and downward directions. Thereby, the up/down movement of the lower chamber 13 is guided by the guide pillars 31. Further, it should be noted that the lower chamber 13 carries another hydraulic cylinder 30 that moves the stage 17 up and down. Thereby, the rods 18 engaging with the lower chamber 13 at the holes 13c act as a guide rod for guiding the up/down movement of the stage 17.

Similarly, the upper chamber 12 is connected to guide pillars 35 that in turn engage movably with an upper base 34. The upper base 34 carries a hydraulic cylinder 36 that moves the upper chamber 12 in upward and downward directions. Thereby, the up/down movement of the upper chamber 12 is guided by the guide pillars 35 engaging the upper base 34.

It should be noted that the upper chamber 12 carries a hydraulic cylinder 29, wherein the hydraulic cylinder 29 moves the rods 26 up and down via a connection member 28. Thereby, the sheet 24 is moved up and down in response to the activation of the hydraulic cylinder 29. In FIG. 5, the illustration of the evacuation port 13b is omitted for the sake of simplicity of the drawing.

Figure 6A:
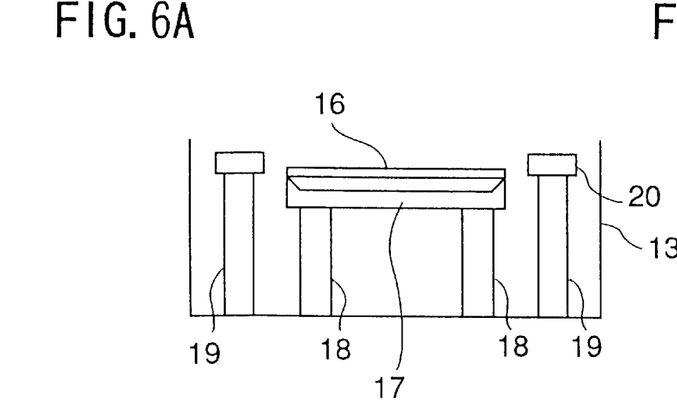
FIGS. 6A–6D are diagrams showing the process of attaching a tape in the apparatus of FIG. 4.
Figure 6B:
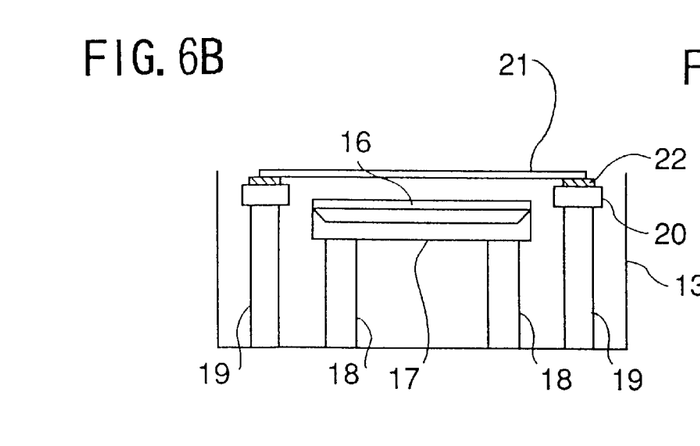

FIG. 6A shows the state in which the upper chamber 12 is lifted up and the lower chamber 13 is opened. In this state, the wafer 16 is mounted upon the wafer stage 17 by a handling mechanism not shown, and the tape 21 mounted upon the ring-shaped frame 22 is placed upon the frame stage 20 also by a handling mechanism as indicated in FIG. 6B.

Figure 6C:
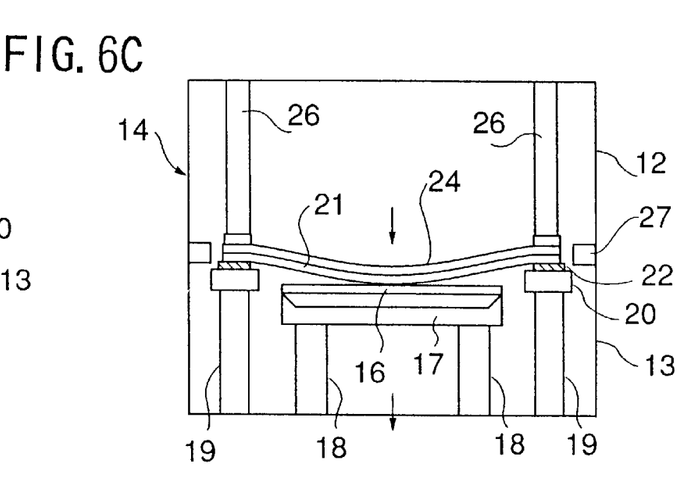

Next, in the step of FIG. 6C, the upper chamber 12 is engaged with the lower chamber 13, and the chamber 14 is evacuated. Further, the rods 26 are lowered by activating the hydraulic cylinder 29 of FIG. 5, until the downwardly bulging sheet 24 causes a corresponding deformation in the tape 21 and the bottom of the downwardly bulging tape 21 contacts with the rear surface 16b of the wafer 16 where no semiconductor devices are formed.

In the state of FIG. 6C where the bottom of the downwardly-bulging tape 21 contacts with the wafer 16, it should be noted that only the force corresponding to the weight of the sheet 24 is applied to the wafer 16. The weight of the tape 21 itself is negligible. Thus, there is absolutely no risk that the wafer 16 is damaged by the force applied to the wafer 16. Further, the sheet 24 is flexible and deforms according to the shape of the surface 16b of the wafer 16. Thus, even when the control of positioning of the rods 26 is poor, no damage is applied to the wafer 16.

Figure 6D:
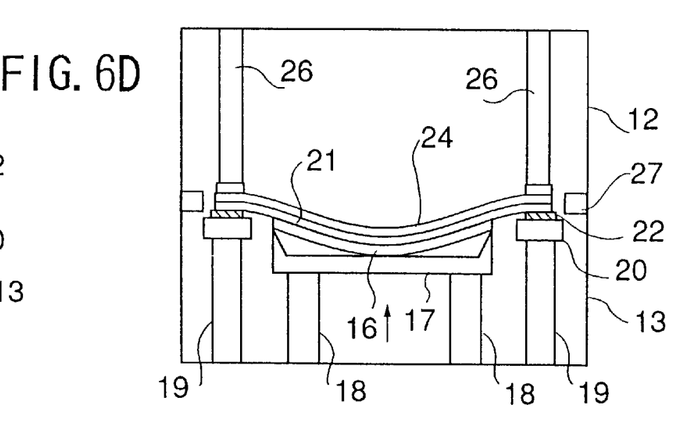

Next, in the step of FIG. 6D, the stage 17 is lifted in the upward direction by activating the hydraulic cylinder 30. Thereby, the area of the contact of the tape 21 and the wafer 16 increases with increasing height of the wafer 16.

In the state of FIG. 6D, it should be noted that the area of contact of the tape 21 spreads in a radial direction from the central part to the marginal part of the wafer 16 as indicated by arrows in FIG. 7. Thus, the formation of void between the tape 21 and the wafer 16 is positively prevented even in the case in which the surface 16b of the wafer 16 is concaved. Thereby, an intimate contact is guaranteed between the wafer 16 and the tape 21. In the step of FIG. 6D, too, no damage is caused in the wafer 16, as the deformation of the tape 21 is caused only by the weight of the sheet 24.

Further, it is possible to control the area of contact of the tape 21 on the wafer 16 by adjusting the relative height of the wafer 16 with respect to the sheet 24. This feature is particularly advantageous when attaching the tape 21 on wafers of various sizes or on only a part of the wafer 16.

FIG. 7 shows the area of contact of the tape 21 with the wafer 16, wherein the area of initial contact increases from the innermost dotted circle to a next dotted circle as a result of lowering of the sheet 24 conducted in the step of FIG. 6C. The area of the contact increases further with the lifting of the stage 17 in the step of FIG. 6D to a circle represented by a continuous line.

Figure 8:
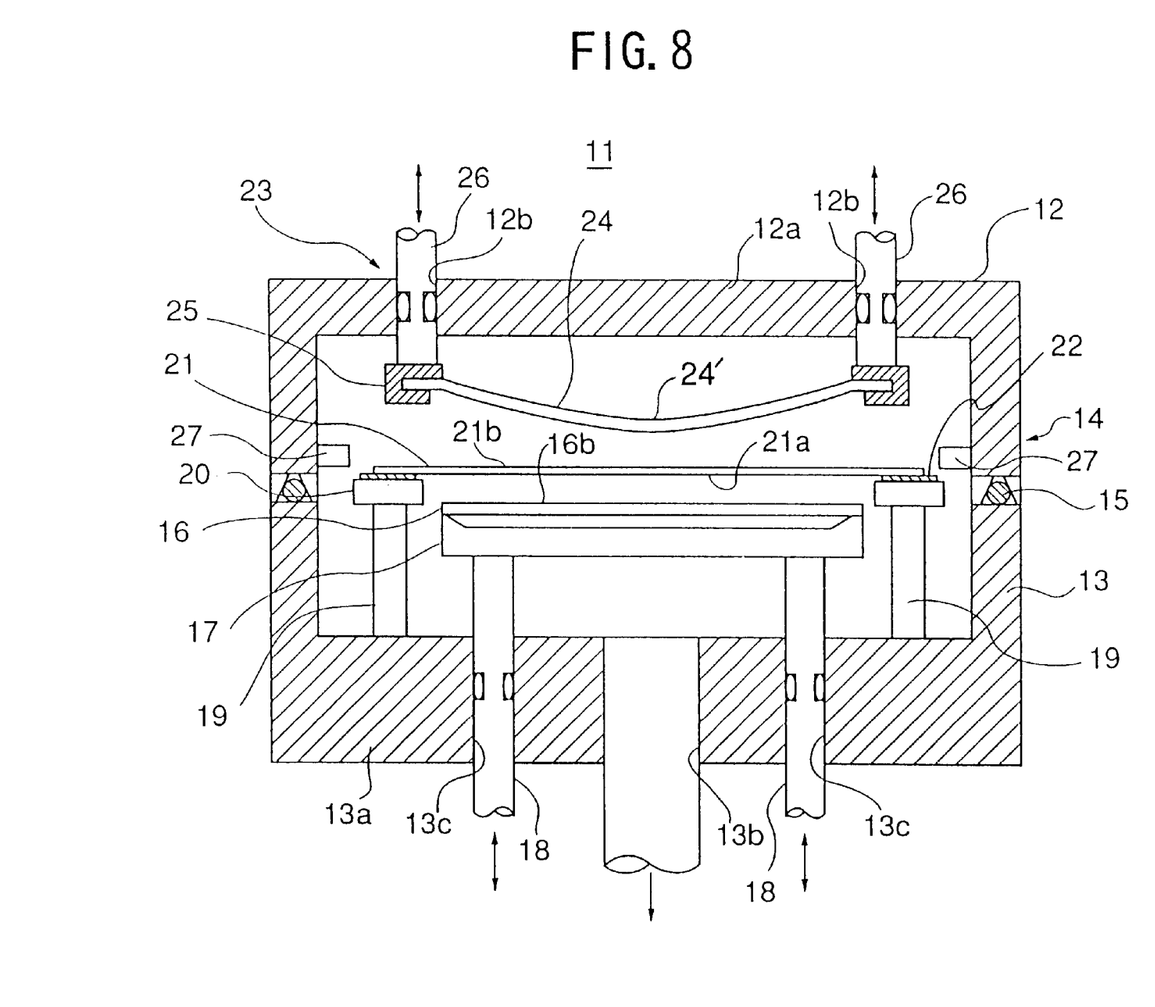
FIG. 8 is a diagram showing a second embodiment of the present invention.

FIG. 8 shows a tape attachment apparatus according to a second embodiment of the present invention, wherein those parts described previously are designated by the same reference numerals and the description thereof will be omitted.

In the embodiment, a second flexible sheet 24' is added to the sheet 24 for adjusting the urging force applied to the tape 21. Thereby, the downward bulging of the tape 21 toward the wafer 16 is adjusted in response to the tensile force of the tape 21 on the frame 22. It should be noted that the number of the additional sheet 24' is by no means limited to one, but two or more additional sheets may be used as necessary.

Figure 9:
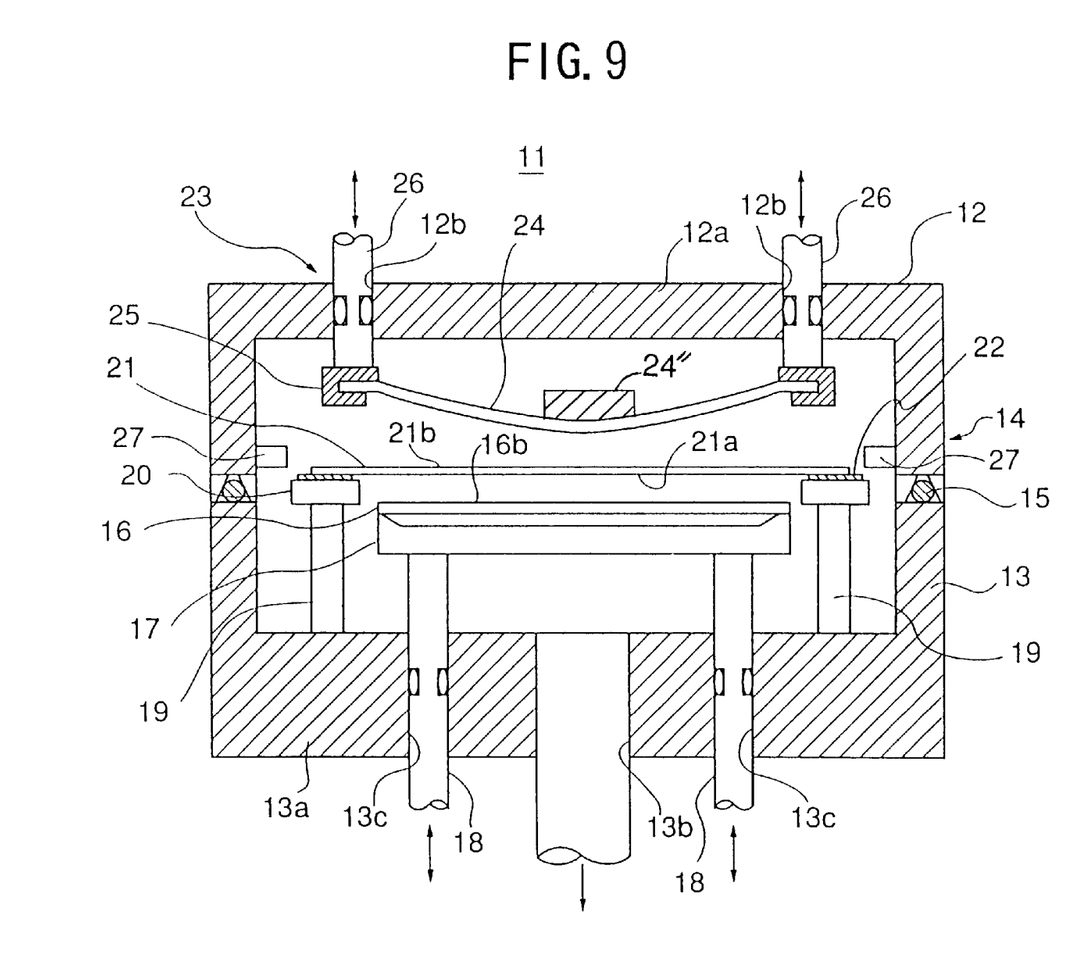
FIG. 9 is a diagram showing a third embodiment of the present invention.

FIG. 9 shows a tape attachment apparatus according to a third embodiment of the present invention, wherein those parts described previously are designated by the same reference numerals and the description thereof will be omitted.

In the embodiment of FIG. 9, a weight 24" is provided on the top side of the sheet 24 for causing a desired downward bulging of the adhesive tape 21. The weight 24" may be formed of any material including metal, ceramics or a flexible material such as a rubber.

Further, the weight of the sheet 24 is not limited to 300 g as described previously with reference to the first embodiment, but the sheet 24 of a different weight may also be used.

Figure 10:
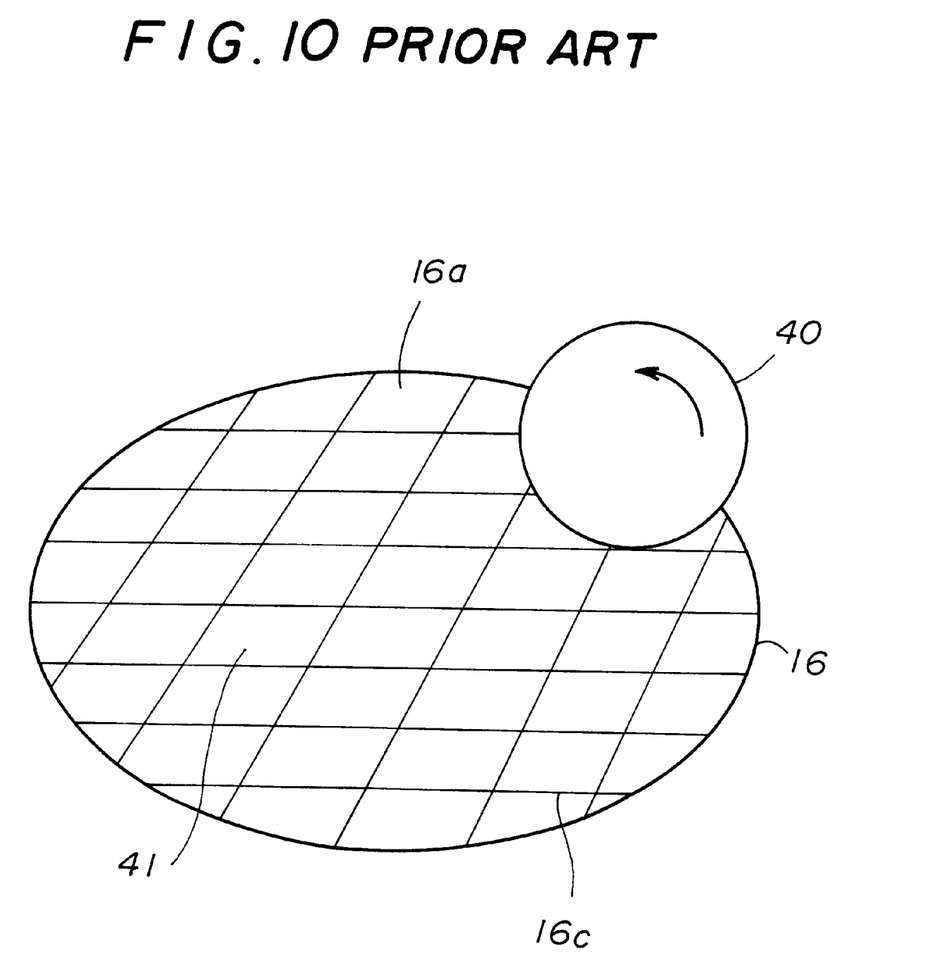
FIG. 10 is a diagram showing a dicing process applied to a taped wafer.

FIG. 10 shows the process of dicing applied to the wafer 16 applied with the tape 21 on the rear surface 16b according to any of the foregoing embodiments. It should be noted that the process of FIG. 10 itself is known.

Referring to FIG. 10, the wafer 16 thus taped is held on a stage not illustrated such that the side 16a on which the semiconductor devices are formed faces in the upward direction. Further, a rotary dicing saw 40 is applied to the foregoing surface 16a along scribe lines 16c. Thereby, the wafer 16 is divided into a plurality of chips 41, wherein the chips 41 maintains the arrangement after the dicing.

According to the present invention, formation of void between the wafer 16 and the tape 21 is eliminated successfully and reliably without damaging semiconductor devices formed on the front side 16a of the wafer 16. Thus, the yield of production of the semiconductor devices is improved substantially. Further, the individual chips 41 are aligned properly after the dicing, as the deformation of the tape 21 caused by excessive urging force as in the case of conventional process explained in FIGS. 1–3 is positively eliminated. Thereby, picking up of the chips by an automatic handler is substantially facilitated.

As the present invention does not use a roller mechanism contrary to the prior art described with reference to FIG. 1, the volume of the vacuum chamber 14 is small and the time needed for the evacuation of the vacuum chamber is minimum. Thereby, the throughput of production of the semiconductor devices is improved.

In any of the foregoing embodiments, it should further be noted that one may use a resilient sheet in place of the flexible sheet 24, as long as the resilient sheet bulges in the downward direction by the gravity. Such a resilient sheet includes a flexible membrane mounted on the ring-shaped frame 22 with an appropriate tensile force that allows the gravitational deformation or bulging of the membrane in the downward direction.

Further, the present invention is by no means limited to the embodiments described heretofore, but various variations and modifications may be made without departing from the scope of the invention.

What is claimed is:

1. A method of producing semiconductor devices, comprising the steps of:

disposing an adhesive tape over a wafer such that an adhesive surface of said tape faces a top surface of said wafer;

disposing a flexible urging member over said tape, said flexible urging member causing a deformation by a gravity such that said flexible urging member causes a bulging in a downward direction toward said adhesive tape;

moving said flexible urging member relatively to said adhesive tape in engagement with said adhesive tape such that said adhesive tape is deformed in conformity with said flexible urging member, said adhesive tape thereby bulging in a downward direction toward said wafer; and contacting said deformed adhesive tape on said top surface of said wafer.

2. A method as claimed in claim 1, wherein said step of contacting said deformed adhesive tape on said top surface of said wafer is conducted such that a bottom part of said deformed tape contacts with said top surface of said wafer at a central part of said top surface and an area of contact increases radially from said central part toward a rim part of said wafer.

3. A method as claimed in claim 1, wherein said step of contacting said deformed adhesive tape on said top surface of said wafer includes a step of lifting up said wafer with respect to said tape such that said wafer engages with a bottom of said downwardly bulging adhesive tape at a central part of said top surface of said wafer, said step of lifting up said wafer being continued further such that said resilient urging member is deformed, via said intervening adhesive tape, in conformity with a shape of said top surface of said wafer.

4. A method as claimed in claim 1, wherein said flexible urging member is a flexible membrane.

5. A method as claimed in claim 4, wherein said flexible membrane has a weight that causes a deformation of said adhesive tape.

6. A method as claimed in claim 1, wherein said flexible urging member includes a plurality of flexible membranes.

7. A method as claimed in claim 1, wherein said flexible urging member comprises a flexible membrane and a weight provided thereon.

8. A method as claimed in claim 1, wherein said flexible urging member includes a membrane having a resiliency.

9. A method as claimed in claim 1, further comprising a step of dicing said wafer in a state that said wafer is covered by said tape at a side opposite to said top surface.

* * * * *